(12) United States Patent
Kang et al.

(10) Patent No.: US 9,940,860 B2
(45) Date of Patent: Apr. 10, 2018

(54) DISPLAY DEVICE (71) Applicant: LG DISPLAY CO., LTD., Seoul (KR)

(72) Inventors: Minha Kang, Seoul (KR); Jaeho Sim, Daegu (KR); Dawoon Jung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/331,032

(22) Filed: Oct. 21, 2016

(65) Prior Publication Data

US 2017/0162093 A1  Jun. 8, 2017

(30) Foreign Application Priority Data

Dec. 4, 2015 (KR) ........................ 10-2015-0172293

(51) Int. Cl.
| | |
|---|---|
| *G09G 3/00* | (2006.01) |
| *H01L 27/12* | (2006.01) |
| *G02F 1/13* | (2006.01) |
| *H01L 51/00* | (2006.01) |

(52) U.S. Cl.
CPC ........... *G09G 3/006* (2013.01); *G02F 1/1309* (2013.01); *H01L 27/124* (2013.01); *H01L 27/1248* (2013.01); *G02F 2201/56* (2013.01); *G09G 2300/0408* (2013.01); *G09G 2300/0426* (2013.01); *G09G 2310/0281* (2013.01); *H01L 51/0031* (2013.01)

(58) Field of Classification Search
CPC ............. H01L 51/0545; H01L 51/0036; H01L 51/0541; H01L 51/5012; H01L 27/3223; H01L 27/124; H01L 27/1248; G09G 3/006

See application file for complete search history.

(56) References Cited

U.S. PATENT DOCUMENTS

| | | |
|---|---|---|
| 2007/0164954 A1 | 7/2007 | Yang et al. |
| 2008/0054798 A1 | 3/2008 | Jeong et al. |
| 2008/0266210 A1 | 10/2008 | Nonaka |
| 2009/0102758 A1 | 4/2009 | Anzai et al. |
| 2009/0189835 A1 | 7/2009 | Kim et al. |
| 2013/0335397 A1 | 12/2013 | Kim |
| 2015/0213763 A1 | 7/2015 | Ota et al. |
| 2016/0240595 A1* | 8/2016 | Kim ................ H01L 27/3211 |

FOREIGN PATENT DOCUMENTS

| | | |
|---|---|---|
| EP | 2674932 A1 | 12/2013 |
| JP | 2006119404 A | 5/2006 |
| JP | 2008216894 A | 9/2008 |

(Continued)

Primary Examiner — Tucker J Wright
(74) Attorney, Agent, or Firm — Dentons US LLP (57) ABSTRACT A display device includes a pixel array, a switch element, and inspection lines. In a display area, at least a portion of an outer region includes a curved section and pixels to which a data line is connected are disposed. The switch element is disposed in a bezel area outside the display area, and supplies a test voltage to the data line in response to an enable signal. The inspection lines connect an inspection pad part and switch elements and are disposed in a staircase form along the curved section. The switch elements are disposed along the inspection lines and include first and second switch elements disposed to be adjacent to each other in a direction perpendicular to each other.

7 Claims, 6 Drawing Sheets (56) References Cited

FOREIGN PATENT DOCUMENTS

| JP | 2008292995 | A | 12/2008 |
| JP | 2009122636 | A | 6/2009 |
| JP | 2010243526 | A | 10/2010 |
| JP | 2013257533 | A | 12/2013 |
| JP | 2015163941 | A | 9/2015 |

* cited by examiner

DISPLAY DEVICE

This application claims the benefit of Korea Patent Application No. 10-2015-0172293 filed on Dec. 4, 2015, the entire contents of which are incorporated herein by reference for all purposes as if fully set forth herein.

BACKGROUND

Field

The present disclosure relates to a display device and a method of manufacturing the same, and more particularly, to a display device having a circular display panel.

Discussion of the Related Art

As information technology has advanced, a market for display devices as connection mediums between users and information has expanded. Thus, display devices using a flat display panel such as a liquid crystal display (LCD), an organic light emitting display device, an electrophoretic display (EPD), and a plasma display panel (PDP) have been increasingly used.

Among the display devices mentioned above, for example, the LCD or the organic light emitting display device includes a display panel including a plurality of subpixels disposed in a matrix and a driver for driving the display panel. The driver includes a scan driver for supplying a scan signal (or a gate signal) to the display panel and a data driver for supplying a data signal to the display panel. The display device displays a specific image as the display panel emits light or allows light to be transmitted therethrough on the basis of power output from a power supply unit and a scan signal and a data signal output from the scan driver and the data driver.

Recently, the use of portable display devices is growing, and, in particular, wearable display devices that may be worn on wrists are on the rise. Wearable display devices may also be implemented on the basis of deformed display panels having a circular or oval shape. While deformed display panels have a curved shape, transistors and signal lines are linearly patterned. Thus, in order to effectively reduce the size of the bezel, an array structure of transistors and signal lines leaves space for improvement.

SUMMARY

Accordingly, the present disclosure is directed to a display device and a method of manufacturing the same that substantially obviate one or more problems due to limitations and disadvantages of the related art.

An advantage of the present disclosure is to provide a display device having a circular display panel with reduced bezel area.

Additional features and advantages of the present disclosure will be set forth in the description which follows, and in part will be apparent from the description, or may be learned by practice of the invention. These and other advantages of the present disclosure will be realized and attained by the structure particularly pointed out in the written description and claims hereof as well as the appended drawings.

To achieve these and other advantages and in accordance with the purpose of embodiments of the invention, as embodied and broadly described herein, a display device may, for example, include a display area having a curved section and a plurality of pixels connected to data lines; a plurality of switch elements in a bezel area outside the display area to supply test voltages to the data lines in response to an enable signal; and an inspection line connecting an inspection pad part and one of the switch elements, wherein the inspection line is disposed in a staircase form along the curved section of the display area, and wherein the switch elements are disposed along the inspection line.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Hereinafter, embodiments of the present disclosure will be described in detail with reference to the accompanying drawings. Like reference numerals refer to like elements throughout. In describing the present invention, if a detailed explanation for a related known function or construction is considered to unnecessarily divert the gist of the present invention, such explanation will be omitted but would be understood by those skilled in the art.

Figure 1:
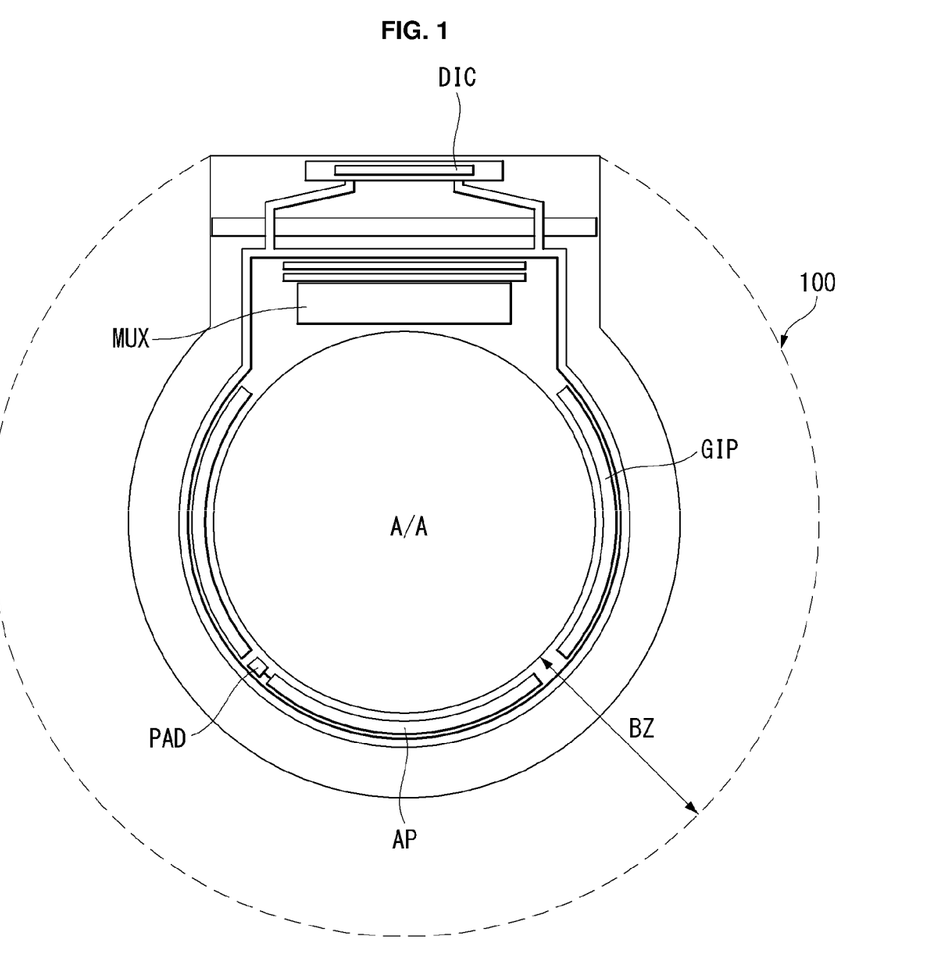
FIG. 1 is a view illustrating a display device according to an embodiment of the present disclosure.

FIG. 1 is a view illustrating a display device according to an embodiment of the present disclosure.

Referring to FIG. 1, the display device according to an embodiment of the present disclosure includes a display panel 100 and a driving circuit DIC. The display panel 100 includes a pixel array area AA in which pixels are disposed and a bezel BZ surrounding the pixel array area AA. The driving circuit DIC includes a timing controller, a data driver, and a power supply unit.

Figure 2:
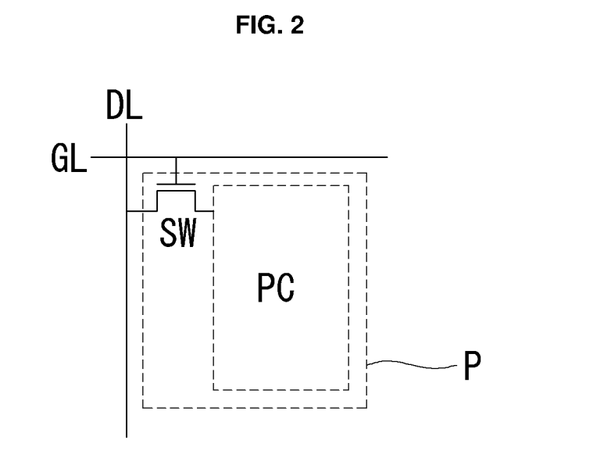
FIG. 2 is a view illustrating an example of a pixel illustrated in FIG. 1.

Pixels P illustrated in FIG. 2 are formed in the pixel array area AA of the display panel 100. Each of the pixels P is formed in a region in which a data line DL and a gate line GL intersect with each other. Each of the pixels P operates in response to a scan signal supplied through a switching element SW connected to the gate line GL and the data line DL to represent a gray level with brightness corresponding to a data voltage. A pixel circuit PC and the switching element SW of each of the pixels P may be implemented in different forms depending on types of display panels.

The driving circuit DIC may be integrated into a drive IC so as to be attached to a bezel BZ. The driving circuit DIC may include a timing controller and a data driver. The timing controller receives digital video data RGB and receives timing signals such as a vertical synchronization signal Vsync, a horizontal synchronization signal Hsync, a data enable signal DE, a main clock CLK, and the like. The timing controller transmits digital data of an input image to the data driver, and controls an operation timing of the data driver and the gate driver GIP. In response to a data timing control signal supplied from the timing controller, the data driver samples video digital data, and in response to a gamma reference voltage, the data driver converts digital video data into analog data voltages and outputs the converted analog data voltages to the data lines.

The power supply unit generates a high potential driving voltage VDD and a low potential driving voltage VSS to be supplied to the display panel. The power supply unit generates a gate high voltage VGH and a gate low voltage VGL to be supplied to the gate driver GIP, as well as power VDD or VSS to be supplied to the display panel 100, on the basis of input power supplied from the outside. The high potential driving voltage VDD and the low potential driving voltage VSS are voltages for driving the pixel circuit PC.

A multiplexer MUX is disposed between the driving circuit DIC and the pixel array area AA, and distributes data voltages provided from the driving circuit DIC to a plurality of data lines DL.

The gate driver outputs a gate pulse Gout using a gate timing enable signal. The gate driver includes a shift register. The shift register includes multiple stages which are dependently connected to each other. In response to a start pulse, the shift register starts to output a gate pulse, and shifts an output according to a shift clock. Output signals sequentially output from the shift register are supplied as gate pulses to the gate lines.

The inspection part AP is used for an auto probe inspection process and includes switch elements that supplies a test voltage to the pixel array area AA. The auto probe inspection process is to inspect a defect, or the like, of various signal lines disposed on the substrate before a driving circuit is mounted.

Figure 3:
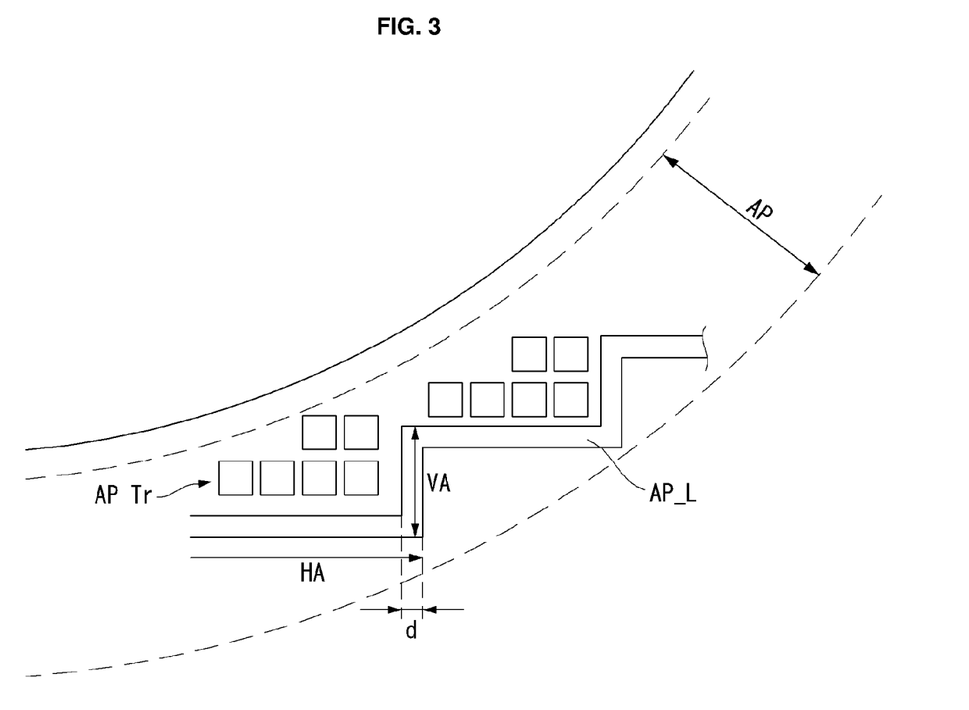
FIG. 3 is a view illustrating an array structure of an inspection part.

FIG. 3 is a view illustrating an array structure of the inspection part AP.

Figure 6:
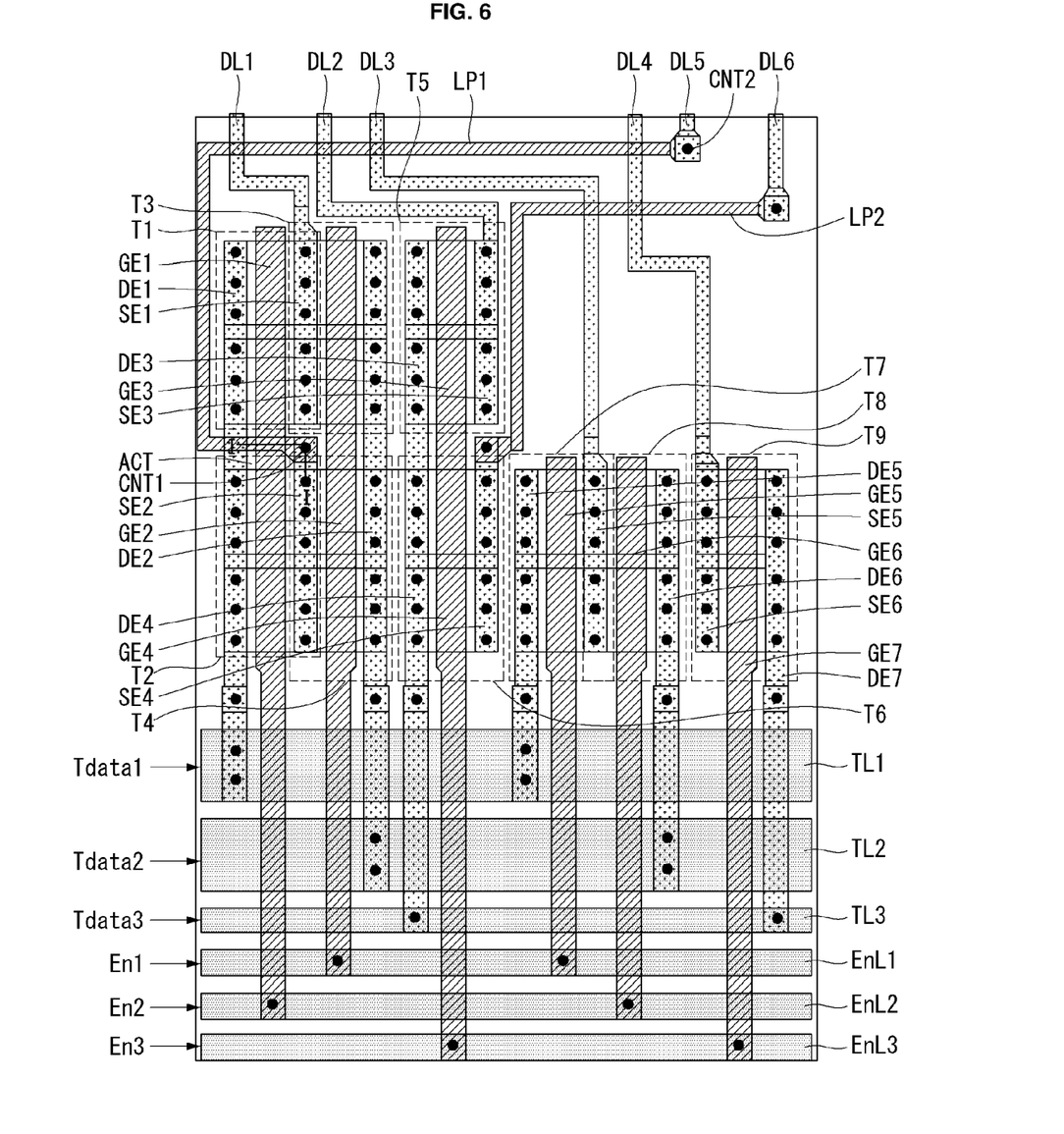
FIG. 6 is a plan view illustrating an example of an array of an inspection part.

Referring to FIG. 3, the inspection part AP includes a plurality of switch elements AP Tr and inspection lines AP_L. The inspection lines AP_L are disposed in a staircase form, and the switch elements AP Tr are disposed along the inspection lines AP_L. In more detail, as illustrated in FIG. 6, the inspection lines AP_L include data lead-in lines TL1, TL2, and TL3 and enable signal lines EnL1, EnL2, and EnL3. The inspection lines AP_L are disposed in a staircase form along a curved section of the pixel array area AA.

The switch elements AP Tr are arranged along the inspection line AP_L. In particular, since the switch elements AP Tr are disposed in at least two or more rows, boundaries of regions in which the switch elements AP Tr are disposed are disposed in a staircase form. The switch elements AP Tr disposed in the staircase form may reduce a region in which the inspection part AP is disposed. This will now be described in detail.

Figure 4:
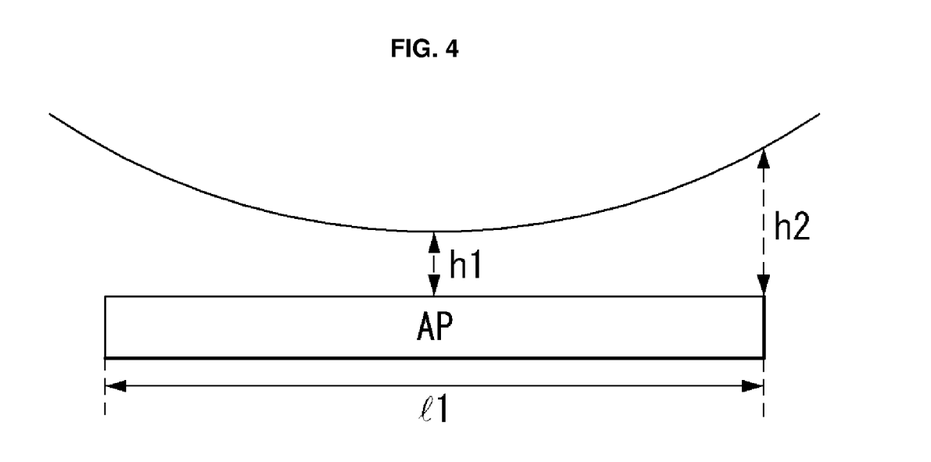
FIGS. 4 and 5 are views illustrating a change in a bezel according to a shape of an inspection part.

FIG. 4 is a view illustrating a linear inspection part disposed in a circular pixel array as a comparative example.

Referring to FIG. 4, when the inspection part AP is disposed in a linear form at an end of the circular pixel array area AA, an interval h2 between opposing ends of the inspection part AP and the pixel array area AA is greater than an interval h1 between the center of the inspection part AP and the pixel array area AA. That is, in the array structure of the inspection part AP illustrated in FIG. 4, a size of the bezel may increase at opposing ends of the inspection part AP.

Figure 5:
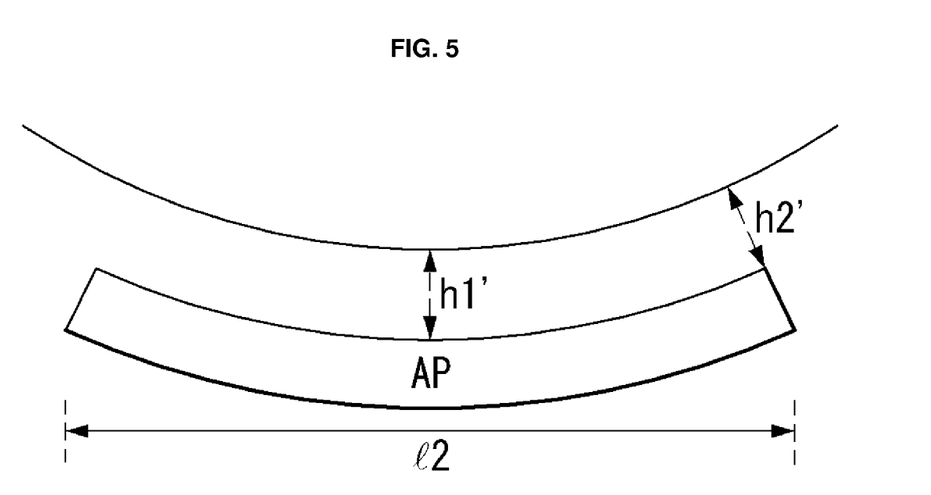

In order to reduce the interval between the pixel array area AA and opposing ends of the inspection part AP, the inspection part AP is beneficially disposed to correspond to the curved shape of the pixel array area AA. When the inspection line AP_L is implemented in the staircase form, a length of the inspection line AP_L in a horizontal direction may be lengthened by a width d of a vertical portion VA. As a result, l2 of a curved inspection part AP in a horizontal direction illustrated in FIG. 5 is longer than a length l1 of the linear inspection part AP in the horizontal direction illustrated in FIG. 4.

In contrast, as illustrated in FIG. 3, in the array structure of the inspection part AP according to an embodiment of the present disclosure, since at least a pair of switch elements AP Tr are disposed to be adjacent to each other vertically, a length of a horizontal portion HA in which the switch elements AP Tr are disposed may be reduced. As a result, an increase in the horizontal length of the inspection part AP due to the width d of the inspection line AP_L in the vertical portion VA may be reduced or prevented.

Figure 7:
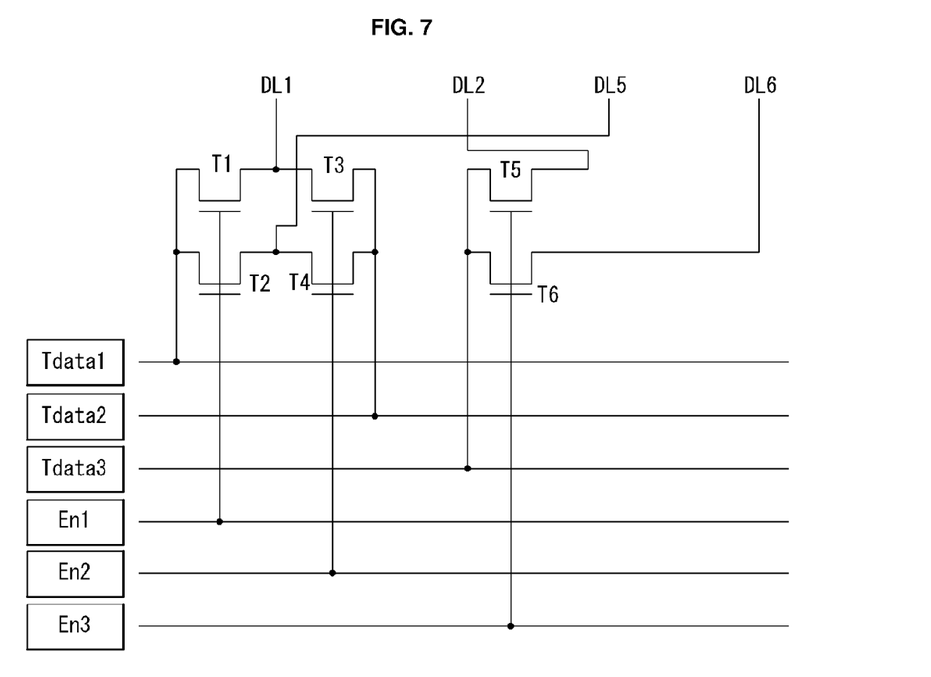
FIG. 7 is an equivalent circuit diagram of inspection switch elements illustrated in FIG. 6.
Figure 8:
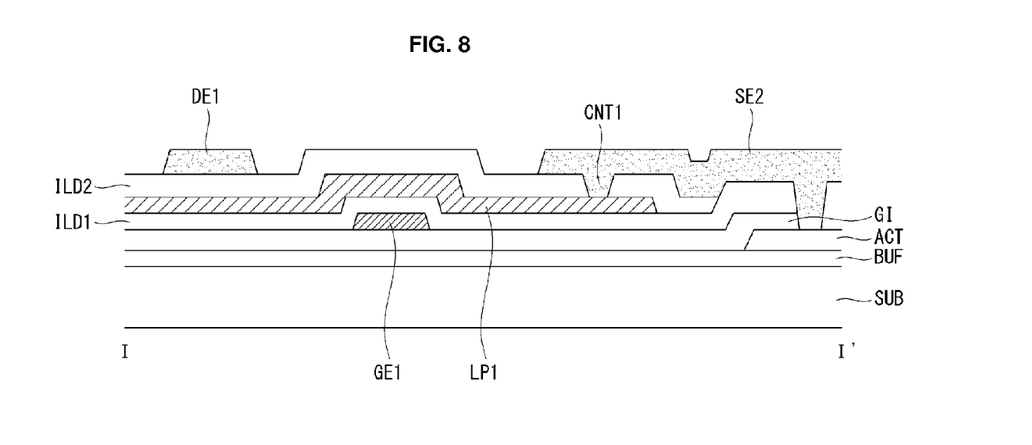
FIG. 8 is a cross-sectional view taken along line I-I' of FIG. 6.

FIG. 6 is a plan view illustrating an array structure of an inspection part according to an embodiment of the present disclosure, and FIG. 7 is an equivalent circuit diagram of switch elements disposed in a vertical direction among switch elements illustrated in FIG. 6.

Referring to FIGS. 6 and 7, the inspection part AP according to an embodiment of the present disclosure includes a first switch element T1 to a third switch element T9 respectively operated by a first enable signal En1 to a third enable signal En3.

The first switch element T1 includes a first gate electrode GE1, a first drain electrode DE1, and a first source electrode SE1, and the second switch element T2 includes the first gate electrode GE1, the first drain electrode DE1, and a second source electrode SE2. The third switch element T3 includes a second gate electrode GE2, a second drain electrode DE2, and a first source electrode SE1, and a fourth switch element T4 includes the second gate electrode GE2, the second drain electrode DE2, and the second source electrode SE2.

The first switch element T1 and the second switch element T2 share the first gate electrode GE1 and the first drain electrode DEL The third switch element T3 and the fourth switch element T4 share the second gate electrode GE2 and the second drain electrode DE2. Also, the first switch element T1 and the third switch element T3 share the first source electrode SE1 and the second switch element T2 and the fourth switch element T4 share the second source electrode SE2.

The first source electrode SE1 and the second source electrode SE2 are disposed at the same vertical axis. The first source electrode SE1 is connected to a first data line DL1, and the second source electrode SE2 is connected to a fifth data line DL5 through a first link pattern LP1. The first gate electrode GE1 is disposed on one side of the first source electrode SE1. The first drain electrode DE1 is disposed to be adjacent to the first source electrode SE1 with the first gate electrode GE1 interposed therebetween. The second gate electrode GE2 is disposed on one side of the first source electrode SE1. The second drain electrode DE2 is disposed to be adjacent to the second source electrode SE2 with the second gate electrode GE2 interposed therebetween.

The first drain electrode DE1 is connected to a first data lead-in line TL1, and the first gate electrode GE1 is connected to a second enable signal line EnL2. As a result, the first switch element T1 and the second switch element T2 supply a first test voltage Tdata1 to the first data line DL1 and the fifth data line DL5 in response to a second enable signal En2.

The second drain electrode DE2 is connected to a second data lead-in line TL2, and the second gate electrode GE2 is connected to a first enable signal line EnL1. As a result, the third switch element T3 and the fourth switch element T4 supply a second test voltage Tdata2 to the first data line DL1 and the fifth data line DL5 in response to a first enable signal En1.

A fifth switch element T5 includes a third gate electrode GE3, a third drain electrode DE3, and a third source electrode SE3, and a sixth switch element T6 includes the third gate electrode GE3, the third drain electrode DE3, and a fourth source electrode SE4. The fifth switch element T5 and the sixth switch element T6 share the third gate electrode GE3 and the third drain electrode DE3.

The third source electrode SE3 and the fourth source electrode SE4 are disposed at the same vertical axis. The third source electrode is connected to the second data line DL2, and the fourth source electrode is connected to a sixth data line DL6 through a second link pattern LP2. The third gate electrode GE3 is disposed on one side of the third source electrode SE3. The third drain electrode DE3 is disposed to be adjacent to the third source electrode SE3 with the third gate electrode GE3 interposed therebetween.

The third drain electrode DE3 is connected to the third data lead-in line TL3, and the third gate electrode GE3 is connected to a third enable signal line EnL3. As a result, the fifth switch element T5 and the sixth switch element T6 supply a third test voltage Tdata3 to the second data line DL2 and the sixth data line DL6 in response to a third enable signal En3.

A seventh switch element T7 includes a fourth gate electrode GE4, a fourth drain electrode DE4, and a fifth source electrode SE5, and an eighth switch element T8 includes a fifth gate electrode GE5, a fifth drain electrode DE5, and a fifth source electrode SE5. The seventh switch element T7 and the eighth switch element T8 share the fifth source electrode SE5.

The fifth source electrode SE5 is connected to the third data line DL3. The fourth gate electrode GE4 and the fifth gate electrode GE5 are disposed on both sides of the fifth source electrode SE5. The fourth drain electrode DE4 is disposed to be adjacent to the fifth source electrode SE5 with the fourth gate electrode GE4 interposed therebetween. The fifth drain electrode DE5 is disposed to be adjacent to the fifth source electrode SE5 with the fourth gate electrode GE4 interposed therebetween.

The fourth drain electrode DE4 is connected to the first data lead-in line TL1, and the fourth gate electrode GE4 is connected to the first enable signal line EnL1. The fifth drain electrode DE4 is connected to the second data lead-in line TL2, and the fifth gate electrode GE5 is connected to the second enable signal line EnL2.

As a result, the seventh switch element T7 supplies a first test voltage Tdata1 to the second data line DL2 in response to a first enable signal En1. The eighth switch element T8 supplies a second test voltage Tdata2 to the second data line DL2 in response to a second enable signal En2.

A ninth switch element T9 includes a sixth gate electrode GE6, a sixth drain electrode DE6, and a sixth source electrode SE6. The sixth source electrodes SE6 is connected to the fourth data line DL4. The sixth gate electrode GE6 is disposed on one side of the sixth source electrodes SE6. The sixth drain electrode DE6 is disposed to be adjacent to the sixth source electrode SE6 with the sixth gate electrodes SE6 interposed therebetween.

The sixth drain electrode DE6 is connected to the third data lead-in line TL3, and the sixth gate electrode GE6 is connected to the third enable signal line EnL3. As a result, the ninth switch element T9 supplies a third test voltage Tdata3 to the fourth data line DL4 in response to the third enable signal En3.

The test voltages provided to the respective data lines DL through the first to third data lead-in lines TL1, TL2, and TL3 during the AP inspection process may be three primary colors of red (R), green (G), and blue (B). For example, the first test voltage Tdata1 may be a red test voltage, the second test voltage Tdata2 may be a blue test voltage, and the third test voltage Tdata3 may be a blue test voltage. Also, the first to third enable signals En1, En2, and En3 may be applied in a time-division manner.

In FIG. 6, since the switch elements are disposed between the second, fourth, and sixth transistors T2, T4, and T6 and the pixel array area AA, the second source electrode SE2 and the fourth source electrode SE4 may not be directly connected to data lines. Thus, the second source electrode SE2 and the fourth source electrode SE4 are connected to data lines through a first link pattern LP1 and a second link pattern LP2, respectively. The first and second link patterns LP1 and LP2 are patterned on a metal layer separated by an insulating film from a gate electrode and a drain electrode in order to prevent a short.

FIG. 7 is a cross-sectional view taken along line I-I' of FIG. 6. A cross-section of the region in which the first link pattern is disposed will be described with reference to FIG. 7.

Hereinafter, a cross-sectional structure of switch elements will be described with reference to FIGS. 6 and 7. FIGS. 6 and 7 illustrate a region in which a second enable signal pattern is disposed, but the same configuration may be formed using the same material and method. Hereinafter, each component will be generally referred to in the cross-sectional structure of the switch elements. For example, FIGS. 6 and 7 illustrate only a second enable signal pattern but first to sixth enable signal patterns will be generally referred to as an "enable signal pattern (MP)".

A buffer layer BUF is formed on a substrate SUB, and a semiconductor active layer ACT is disposed on the buffer layer BUF. The semiconductor active layer ACT may be formed to cover a region in which a gate electrode GE, a source electrode SE, and a drain electrode DE are to be disposed. A gate insulating layer GI is formed to cover the buffer layer BUF.

Gate electrodes GE are disposed on the gate insulating layer GI. A first interlayer insulating layer ILD1 is formed to cover the gate electrodes GE, and a first link pattern LP1 is disposed on the first interlayer insulating layer ILD1. A second interlayer insulating layer ILD2 is disposed to cover the first link pattern LP1, and a first drain electrode DE1 and a second source electrode SE2 are disposed on the second interlayer insulating layer ILD2. The second source electrode SE2 is connected to the first link pattern LP1 through a first contact hole CNT1.

As described above, since the inspection line AP_L is disposed in a staircase form and some of the switch elements AP Tr are vertically disposed, the bezel BZ of the region where the inspection part AP is disposed may be reduced. The array structure of the switch elements illustrated in FIGS. 6 and 7 represents an embodiment, and the number and position of vertically adjacent switch elements are not limited to the embodiment illustrated in the drawings.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display area having a curved section and a plurality of pixels connected to data lines;
   a plurality of switch elements in a bezel area outside the display area to supply test voltages to the data lines in response to an enable signal; and
   an inspection line connecting an inspection pad part and one of the switch elements,
   wherein the inspection line is disposed in a staircase form along the curved section of the display area and has a horizontal portion and a vertical portion between the display area and a periphery of the bezel area,
   wherein the switch elements include first and second switch elements that are disposed along the vertical portion of the inspection line and face each other in a direction parallel to the vertical portion of the inspection line, and
   wherein the inspection line includes a data lead-in line and an enable signal line.

2. The display device of claim 1, wherein the first switch element includes a first source electrode connected to a first data line, a second switch element disposed below the first switch element includes a second source electrode connected to a second data line, and the first source electrode and the second source electrode are disposed in a same vertical axis and not connected to each other.

3. The display device of claim 2, wherein the first and second switch elements share a first gate electrode and a first drain electrode disposed on one side of the first and second source electrodes to supply a same test voltage to the first data line and the second data line, respectively, in response to a same enable signal.

4. The display device of claim 3, wherein the inspection unit further includes a third switch element sharing the first source electrode, and wherein the third switch element supplies a test voltage, different from that of the first switch element, to the first data line through the first source electrode.

5. The display device of claim 2, wherein the second source electrode and the second data line are connected through a link pattern, and the link pattern is disposed on a metal layer separated from the first source electrode, a first gate electrode, and a first drain electrode.

6. The display device of claim 5, wherein the link pattern is disposed on a gate insulating layer covering the first gate electrode, the second source electrode is disposed on an interlayer insulating layer covering the link pattern, and the link pattern and the second source electrode are connected through a contact hole penetrating through the interlayer insulating layer.

7. The display device of claim 1, wherein a drain electrode of the first switch and a drain electrode of the second switch are connected to the same enable signal line.

* * * * *